(12) United States Patent
Singh et al.

(10) Patent No.: US 10,353,014 B2
(45) Date of Patent: Jul. 16, 2019

(54) WATCHDOG SCHEME FOR MONITORING A POWER ELECTRONIC INVERTER AND DETERMINING A MANNER OF OPERATING A LOAD

(71) Applicant: Deere & Company, Moline, IL (US)

(72) Inventors: Brij N. Singh, West Fargo, ND (US);
Neal D. Clements, Fargo, ND (US);
Advait Desai, Pune (IN)

(73) Assignee: DEERE & COMPANY, Moline, IL (US)

( * ) Notice: Subject to any disclaimer, the term of this patent is extended or adjusted under 35 U.S.C. 154(b) by 833 days.

(21) Appl. No.: 14/878,290

(22) Filed: Oct. 8, 2015

(65) Prior Publication Data

US 2017/0102437 A1    Apr. 13, 2017

(51) Int. Cl.
| | |
|---|---|
| *G01R 31/40* | (2014.01) |
| *H02M 1/08* | (2006.01) |
| *G01R 31/42* | (2006.01) |
| *H02P 29/68* | (2016.01) |
| *H03K 17/18* | (2006.01) |
| *H02M 7/5387* | (2007.01) |
| *H02M 7/5395* | (2006.01) |

(52) U.S. Cl.
CPC ............. *G01R 31/40* (2013.01); *G01R 31/42* (2013.01); *H02M 1/08* (2013.01); *H02M 7/5395* (2013.01); *H02M 7/53875* (2013.01); *H02P 29/68* (2016.02); *H03K 17/18* (2013.01)

(58) Field of Classification Search
CPC ............. H02H 3/20; H02H 9/041; H02H 9/04
USPC ........................................................ 361/91.1
See application file for complete search history.

(56) References Cited

U.S. PATENT DOCUMENTS

| | | | | |
|---|---|---|---|---|
| 4,432,032 A | * | 2/1984 | Baker | ................... H02M 7/487 327/471 |
| 2010/0079920 A1 | | 4/2010 | Fanic | |
| 2011/0025404 A1 | | 2/2011 | Cassia | |

OTHER PUBLICATIONS

"Easy Automotive Modules" <http://www.infineon.com/dgdl/Infineon-AN2012_10_Evaluation_Kit_with_FS50R07W1E3_B11A-AN-v1.1-en.pdf?fileId=db3a30433afc7e3e013b2746cfe95974>, Apr. 2013.
Great Britain Office Action dated Feb. 24, 2017.

* cited by examiner

*Primary Examiner* — Dharti H Patel
(74) *Attorney, Agent, or Firm* — Harness, Dickey & Pierce, P.L.C.

(57) ABSTRACT

In one example embodiment, a circuit includes a first sub-circuit configured to generate first data corresponding to a frequency and a duration of overloading of a transistor in the inverter, and a second sub-circuit configured to generate second data corresponding to a rate of rise of a voltage and a peak voltage value of the transistor in the inverter. The first sub-circuit and the second sub-circuit are configured to respectively provide the first data and second data as outputs to a controller for analyzing a manner in which a load coupled to the inverter is driven.

17 Claims, 10 Drawing Sheets

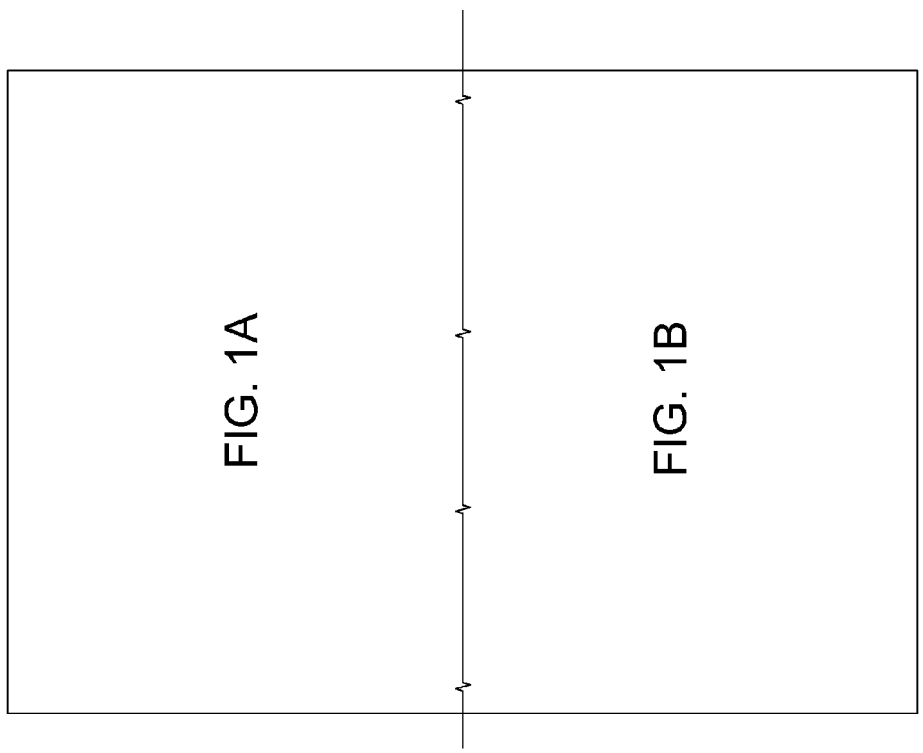

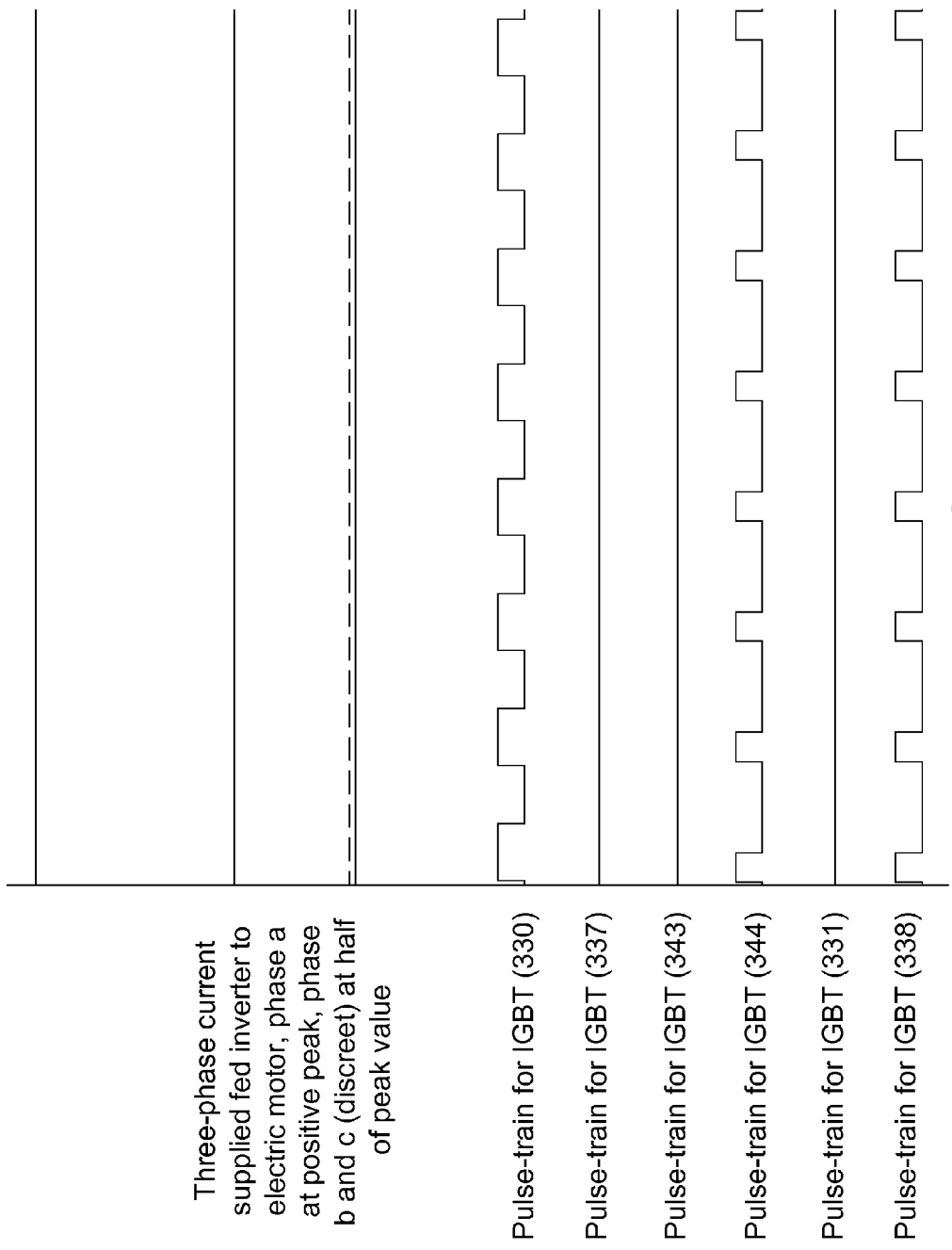

WATCHDOG SCHEME FOR MONITORING A POWER ELECTRONIC INVERTER AND DETERMINING A MANNER OF OPERATING A LOAD

FIELD

Example embodiments are related to electronic drive device systems and methods for monitoring and determining how electric loads, such as electric motors are driven by power electronic inverters.

BACKGROUND

In the process of designing and developing power electronics inverters to be used in hybrid devices such as AC devices, an engineer/designer typically strives to capture product requirements as per intended applications. Once inverters are designed and deployed in hybrid vehicles and such hybrid vehicles are manufactured, the hybrid vehicles are made available to customers. Once in customers' possession, a hybrid vehicle is typically used as per design specifications and requirements. However, there is a possibility that such hybrid vehicles could be abused and used well above specifications, which may lead to faster degradation of electrical components such as switching semiconductors in power-electronic inverters used in such vehicles.

Since utilization of power-electronic inverters in hybrid vehicles is relatively new, a low-cost watchdog scheme for inverters may be advantageous to determine how a hybrid vehicle is driven and what a hybrid vehicle operator's behaviors and expectations are, which may then be used to increase the life-span of electrical components inside the vehicle and/or increase fuel efficiency of such vehicles.

SUMMARY

Some example embodiments are directed to methods and apparatuses for monitoring an operation of a power electronic inverter in order to analyze a manner in which a load connected to the power electronic inverter is driven.

In one example embodiment, a circuit includes a first sub-circuit configured to generate first data corresponding to a frequency and a duration of overloading of a transistor in the inverter, and a second sub-circuit configured to generate second data corresponding to a rate of rise of a voltage and a peak voltage value of the transistor in the inverter. The first sub-circuit and the second sub-circuit are configured to respectively provide the first data and second data as outputs to a controller for analyzing a manner in which a load coupled to the inverter is driven.

BRIEF DESCRIPTION OF THE DRAWINGS

Example embodiments will be more clearly understood from the following detailed description taken in conjunction with the accompanying drawings. FIGS. 1-5B represent non-limiting, example embodiments as described herein.

FIG. 1 is a block diagram of a system for controlling an electrical motor, according to an example embodiment;

FIG. 2 is a block diagram of an electronic data processing system consistent with FIG. 1, according to an example embodiment;

FIG. 3 illustrates an inverter circuit coupled to an inverter watchdog, according to an example embodiment;

FIG. 4 illustrates a monitoring circuit and a switching semiconductor, according to one example embodiment;

FIG. 5 illustrates the generation of outputs of a monitoring circuit, according to one example embodiment;

FIG. 8 illustrates pulse trains generated by monitoring circuits of a monitoring watchdog that monitor switching semiconductors, when a motor is driven under stall conditions, according to one example embodiment.

DETAILED DESCRIPTION OF EXAMPLE EMBODIMENTS

Figure 1A:
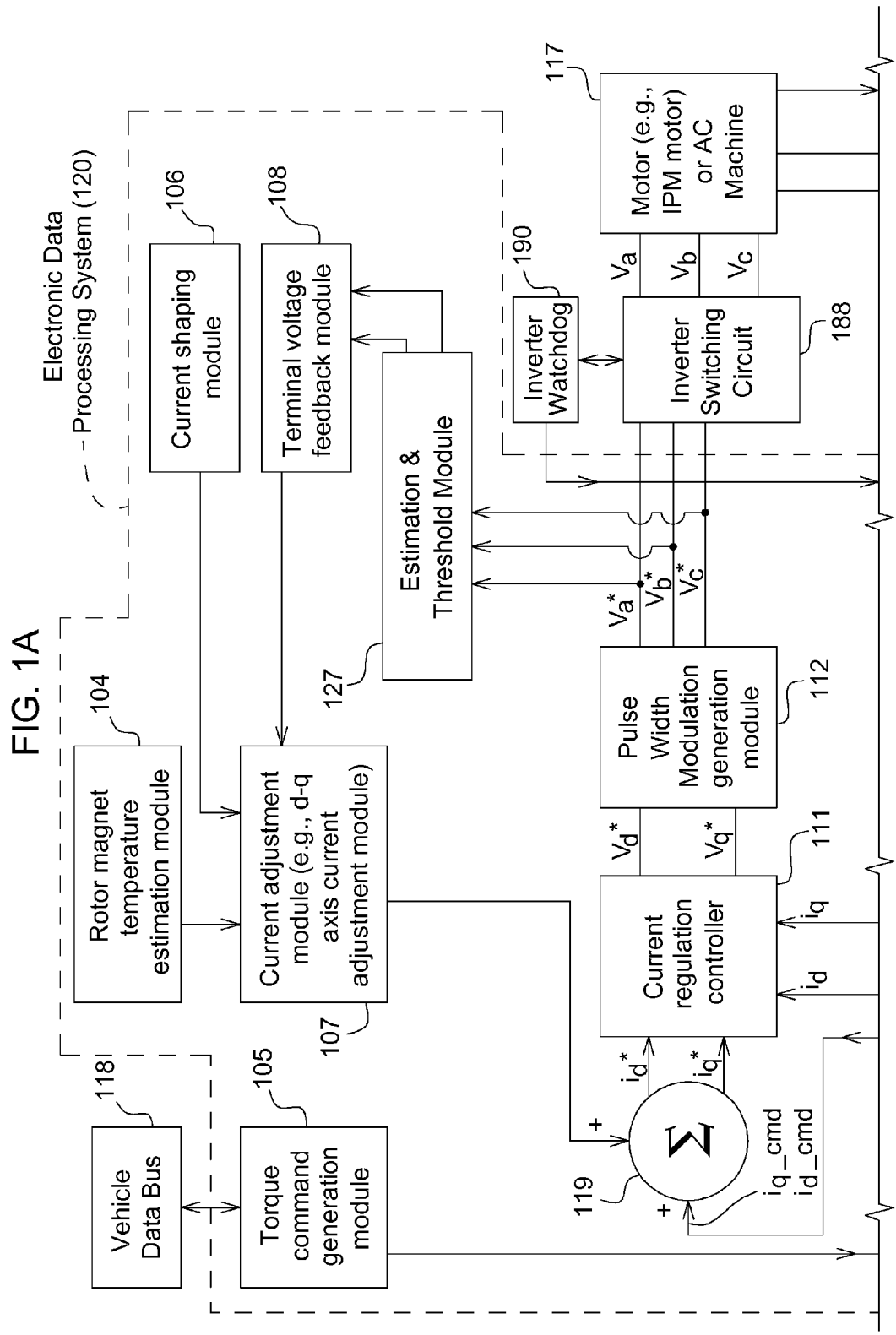
FIG. 1A illustrates a first portion of the system of FIG. 1, according to an example embodiment.

Some example embodiments will now be described more fully with reference to the accompanying drawings in which some example embodiments are illustrated.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments will be described with reference to acts and symbolic representations of operations (e.g., in the form of flowcharts) that may be implemented as program modules or functional processes including routines, programs, objects, components, data structures, etc., that perform particular tasks or implement particular abstract data types and may be implemented using existing hardware. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Further, at least one embodiment of the invention relates to a non-transitory computer-readable storage medium comprising electronically readable control information stored thereon, configured in such that when the storage medium is used in a controller of a magnetic resonance device, at least one embodiment of the method is carried out.

Even further, any of the aforementioned methods may be embodied in the form of a program. The program may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

Note also that the software implemented aspects of example embodiments are typically encoded on some form of tangible (or recording) storage medium or implemented over some type of transmission medium. The tangible storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. Example embodiments are not limited by these aspects of any given implementation.

Some example embodiments are directed to methods and apparatuses for monitoring an operation of a power electronic inverter in order to analyze a manner in which a load connected to the power electronic inverter is driven.

In one example embodiment, a circuit includes a first sub-circuit configured to generate first data corresponding to a frequency and a duration of overloading of a transistor in the inverter, and a second sub-circuit configured to generate second data corresponding to a rate of rise of a voltage and a peak voltage value of the transistor in the inverter. The first sub-circuit and the second sub-circuit are configured to respectively provide the first data and second data as outputs to a controller for analyzing a manner in which a load coupled to the inverter is driven.

In yet another example embodiment, the first sub-circuit is configured to generate the first data during a turn-off event of the transistor.

In yet another example embodiment, the turn-off event takes place when the transistor supplies peak current or near-peak current to the load.

In yet another example embodiment, the first data is a series of pulses.

In yet another example embodiment, the second sub-circuit is configured to generate the second data during the turn-off event of the transistor.

In yet another example embodiment, the second sub-circuit is configured to generate the second data by measuring a voltage across a resistor in the second sub-circuit.

In yet another example embodiment, the controller is configured to analyze the manner in which the load is driven by receiving the first data, and determining the frequency and the duration of overloading the transistor based on frequencies and widths of pulses included in the first data.

In yet another example embodiment, the controller is further configured to analyze the manner in which the load is driven by receiving the second data, determining, based on the second data, a temperature of the transistor during the turn-off event, developing a degradation model for the transistor based on the determined temperature, and determining a schedule for performing a maintenance of the transistor based on the degradation model and a maintenance look-up table.

In yet another example embodiment, the circuit further includes a third sub-circuit coupled to the first and second sub-circuits, the third sub-circuit being configured to operate as an over-voltage protection for the transistor.

In yet another example embodiment, the transistor is one of an Insulated-Gate Bipolar Transistor (IGBT), a metal-oxide Semiconductor Field-Effect Transistor (MOSFET), a Silicon Carbide MOSFET or a Silicon Carbide IGBT. In one example embodiment, a system includes a plurality of transistors forming an inverter and a plurality of circuits. Each of the plurality of circuits being coupled to one of the plurality of transistors, each of the plurality of circuits being configured to monitor the corresponding one of the plurality of transistors by generating first data corresponding to a frequency and a duration of overloading of the corresponding one of the plurality of transistors and generating second data corresponding to a rate of rise of a voltage and a peak voltage value of the corresponding one of the plurality of transistors. Each of the plurality of circuits is configured to provide the corresponding first data and the second data as outputs to a controller for analyzing a manner in which a load coupled to the inverter is driven.

In yet another example embodiment, each of the plurality of transistors includes a first sub-circuit configured to generate the first data during a turn-off event of the corresponding one of the plurality of transistors and a second sub-circuit configured to generate the second data during the turn-off event of the corresponding one of the plurality of transistors.

In yet another example embodiment, the turn-off event takes place when the corresponding one of the plurality of transistors supplies peak or near-peak current to the load.

In yet another example embodiment, the first data is a series of pulses.

In yet another example embodiment, the second sub-circuit is configured to generate the second data by measuring a voltage across a resistor in the second sub-circuit.

In yet another example embodiment, each of the plurality of transistors further includes a third sub-circuit coupled to the first and second sub-circuits, the third sub-circuit being configured to operate as an over-voltage protection for the corresponding one of the plurality of transistors.

In yet another example embodiment, the controller is configured to analyze the manner in which the load is driven by receiving the first data and the second data and analyzing, based on the first data and the second data, the manner in which the load is driven.

In yet another example embodiment, the controller is configured to analyze the manner in which the load is driven by determining the frequency and the duration of overloading the transistors based on a frequency and width of pulses included in the first data.

In yet another example embodiment, the controller is configured to analyze the manner in which the load is driven by determining, based on the second data, a temperature of the corresponding one of the plurality of transistors during the turn-off event, developing a degradation model for the corresponding one of the plurality of transistors based on the determined temperature, and determining a schedule for performing a maintenance of the corresponding one of the plurality of transistors based on the degradation model and a maintenance look-up table.

In yet another example embodiment, each of the plurality of transistors is one of an Insulated-Gate Bipolar Transistor (IGBT), a metal-oxide Semiconductor Field-Effect Transistor (MOSFET), a Silicon Carbide MOSFET or a Silicon Carbide IGBT.

Figure 1B:
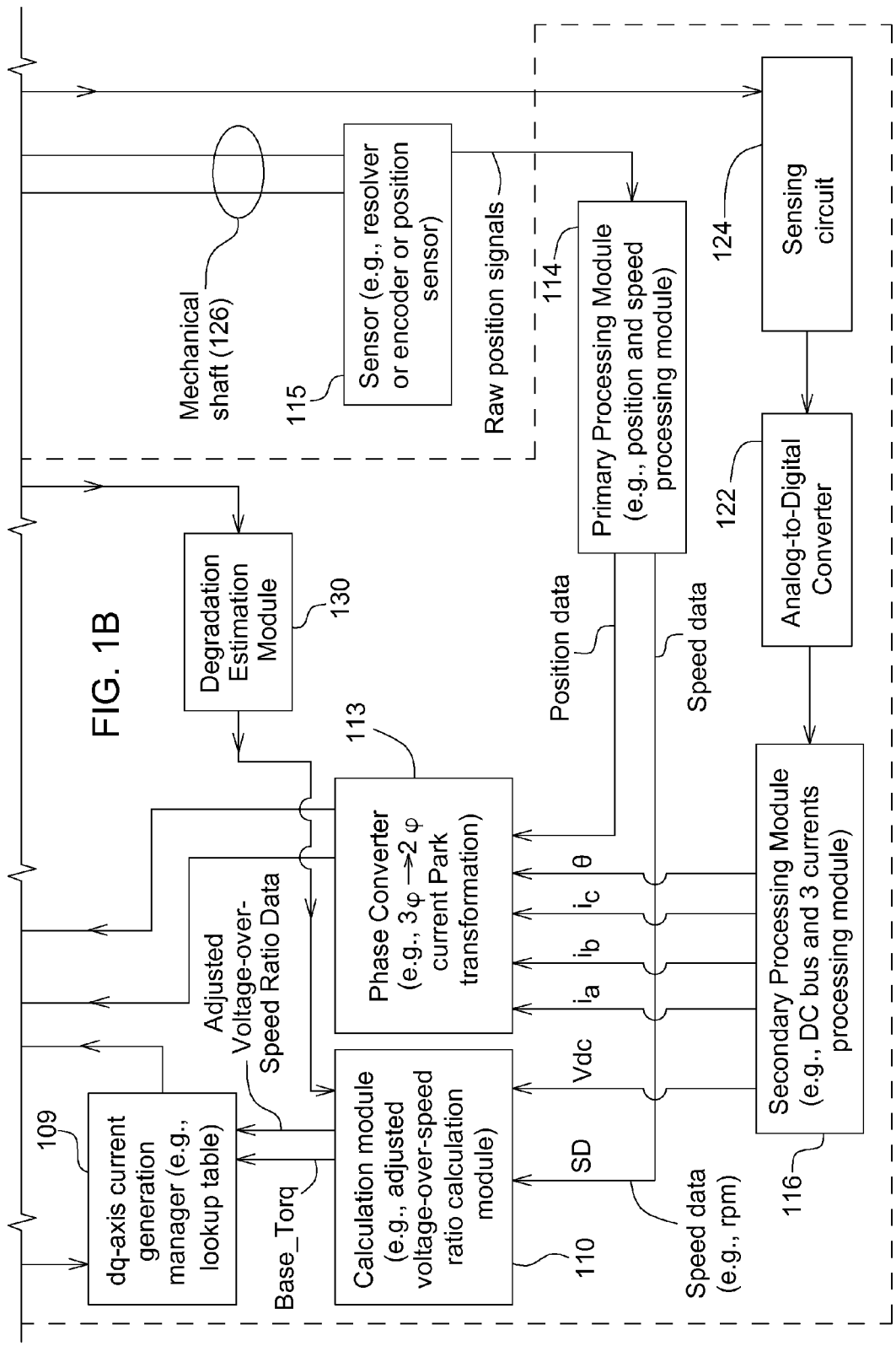
FIG. 1B illustrates a second portion of the system of FIG. 1, according to an example embodiment.

FIG. 1 is a block diagram of a system for controlling an electrical motor, according to an example embodiment. FIG. 1A illustrates a first portion of the system of FIG. 1, according to an example embodiment. FIG. 1B illustrates a second portion of the system of FIG. 1, according to an example embodiment. The electrical motor may be a motor such as a motor 117 (e.g., an interior permanent magnet (IPM) motor) or another alternating current machine controlled by the system 120. Hereinafter, the terms, hybrid machine, electrical motor, AC machine and a motor may be used interchangeably. The motor 117 has a nominal dc bus voltage (e.g., 320 Volts, or 700 Volts, or 1200 Volts, etc.). The nominal voltage is a named voltage. For example, a nominal voltage of the motor 117 may be 320 Volts, but the motor may operate at a voltage above and below 320 Volts.

In an example embodiment, the system 120 may be referred to as a motor controller or an IPM machine system.

The system 120 includes electronic modules, software modules, or both. In an example embodiment, the motor controller includes an electronic data processing system 120 to support storing, processing and execution of software instructions of one or more software modules. The electronic data processing system 120 is indicated by the dashed lines in FIG. 1 and is shown in greater detail in FIG. 2.

In an example embodiment, a torque command generation module 105 is coupled to a d-q axis current generation manager 109 (e.g., d-q axis current generation look-up tables). The d-q axis current refers to the direct axis current and the quadrature axis current as applicable in the context of vector-controlled alternating current machines, such as the motor 117. The output of the d-q axis current generation manager 109 (d-q axis current commands iq_cmd and id_cmd) and the output of a current adjustment module 107 (e.g., d-q axis current adjustment module 107) are fed to a summer 119. In turn, one or more outputs (e.g., direct axis current data (id*) and quadrature axis current data (iq*)) of the summer 119 are provided or coupled to a current regulation controller 111. While the term current command is used, it should be understood that current command refers to a target current value.

The current regulation controller 111 is capable of communicating with the pulse-width modulation (PWM) generation module 112 (e.g., space vector PWM generation module). The current regulation controller 111 receives respective adjusted d-q axis current commands (e.g., id* and iq*) and actual d-q axis currents (e.g., id and iq) and outputs corresponding d-q axis voltage commands (e.g., vd* and vq* commands) for input to the PWM generation module 112.

In an example embodiment, the PWM generation module 112 converts the direct axis voltage and quadrature axis voltage data from two phase data representations into three phase representations (e.g., three phase voltage representations, such as va*, vb* and vc*) for control of the motor 117. va*, vb* and vc* may be referred to as inverter terminal voltages. Outputs of the PWM generation module 112 are coupled to an inverter circuit 188. The output stage of the inverter circuit 188 (e.g., output terminal voltages va, vb and vc) provides a pulse-width modulated voltage waveform or other voltage signal for control of the motor 117. In an example embodiment, the inverter circuit 188 is powered by a direct current (dc) voltage bus.

The inverter circuit 188 includes a semiconductor drive circuit that drives or controls switching semiconductors (e.g., insulated gate bipolar transistors (IGBT) or other power transistors, including but not limited to, a metal-oxide Semiconductor Field-Effect Transistor (MOSFET), a Silicon Carbide MOSFET or a Silicon Carbide IGBT) to output control signals for the motor 117. In turn, the inverter circuit 188 is coupled to the motor 117. The motor 117 is associated with a sensor 115 (e.g., a position sensor, a resolver or encoder position sensor) that is associated with the motor shaft 126 or the rotor. The sensor 115 and the motor 117 are coupled to the data processing system 120 to provide feedback data (e.g., current feedback data, such as phase current values ia, ib and ic), raw position signals, among other possible feedback data or signals, for example. Other possible feedback data includes, but is not limited to, winding temperature readings, semiconductor temperature readings of the inverter circuit 188, three phase voltage data, or other thermal or performance information for the motor 117.

The inverter circuit 188 is also connected to an inverter watchdog circuit 190. As will be further described below, the inverter watchdog circuit 190 produces a series of outputs during the operation thereof (e.g., turning on/off of the switching semiconductors of the inverter circuit 188). In one example embodiment, the system 120, via a degradation estimation module 130, uses the series of outputs to determine a manner in which the motor 117 is driven by an operator thereof as well as a maintenance schedule for the switching semiconductors of the inverter circuit 188. A shown in FIG. 1, the inverter watchdog 190 communicates with the system 120 and more specifically with the degradation estimation module 130.

The motor 117 is associated with the sensor 115 (e.g., a resolver, encoder, speed sensor, or another position sensor or speed sensors) that estimates at least one of an angular position of the motor shaft 126, a speed or velocity of the motor shaft 126, and a direction of rotation of the motor shaft 126. The sensor 115 may be mounted on or integral with the motor shaft 126. The output of the sensor 115 is capable of communication with the primary processing module 114 (e.g., position and speed processing module). In an example embodiment, the sensor 115 may be coupled to an analog-to-digital converter (not shown) that converts analog raw position data or velocity data to digital raw position or velocity data, respectively. In other example embodiments, the sensor 115 (e.g., digital position encoder) may provide a digital data output of raw position data or velocity data for the motor shaft 126 or rotor.

A first output (e.g., position data θ for the motor 117) of the primary processing module 114 is communicated to the phase converter 113 (e.g., three-phase to two-phase current Park transformation module) that converts respective three-phase digital representations of measured current into corresponding two-phase digital representations of measured current. A second output (e.g., speed data SD for the motor 117) of the primary processing module 114 is communicated to the calculation module 110 (e.g., adjusted voltage over speed ratio module).

An input of a sensing circuit 124 is coupled to terminals of the motor 117 for sensing at least the measured three-phase currents and a voltage level of the direct current (dc) bus (e.g., high voltage dc bus which may provide dc power to the inverter circuit 188). An output of the sensing circuit 124 is coupled to an analog-to-digital converter 122 for digitizing the output of the sensing circuit 124. In turn, the digital output of the analog-to-digital converter 122 is coupled to the secondary processing module 116 (e.g., dc bus voltage and three phase current processing module). For example, the sensing circuit 124 is associated with the motor 117 for measuring three phase currents (e.g., current applied to the windings of the motor 117, back EMF (electromotive force) induced into the windings, or both).

Certain outputs of the primary processing module 114 and the secondary processing module 116 feed the phase converter 113. For example, the phase converter 113 may apply a Park transformation or other conversion equations (e.g., certain conversion equations that are suitable are known to those of ordinary skill in the art) to convert the measured three-phase representations of current into two-phase representations of current based on the digital three-phase current data ia, ib and is from the secondary processing module 116 and position data θ from the sensor 115. The output of the phase converter 113 module (id, iq) is coupled to the current regulation controller 111.

Other outputs of the primary processing module 114 and the secondary processing module 116 may be coupled to inputs of the calculation module 110 (e.g., adjusted voltage over-speed ratio calculation module). For example, the primary processing module 114 may provide the speed data SD (e.g., motor shaft 126 speed in revolutions per minute), whereas the secondary processing module 116 may provide a measured (detected) level of the operating dc bus voltage Vdc of the motor 117 (e.g., on the dc bus of a vehicle). The dc voltage level on the dc bus that supplies the inverter circuit 188 with electrical energy may fluctuate or vary because of various factors, including, but not limited to, ambient temperature, temperature of power electronic devices, damage suffered by power electronic devices even during and/or within the design life cycle of power electronic inverter, battery condition, battery charge state, battery resistance or reactance, fuel cell state (if applicable), motor load conditions, respective motor torque and corresponding operational speed, and vehicle electrical loads (e.g., electrically driven air-conditioning compressor). The calculation module 110 is connected as an intermediary between the secondary processing module 116 and the d-q axis current generation manager 109. The output of the calculation module 110 can adjust or impact the current commands iq_cmd and id_cmd generated by the d-q axis current generation manager 109 to compensate for fluctuation or variation in the dc bus voltage, among other things.

The rotor magnet temperature estimation module 104, the current shaping module 106, and the terminal voltage feedback module 108 are coupled to or are capable of communicating with the d-q axis current adjustment module 107. In turn, the d-q axis current adjustment module 107 may communicate with the d-q axis current generation manager or the summer 119.

The rotor magnet temperature estimation module 104 estimates or determines the temperature of the rotor permanent magnet or magnets. In an example embodiment, the rotor magnet temperature estimation module 104 may estimate the temperature of the rotor magnets from, one or more sensors located on the stator, in thermal communication with the stator, or secured to the housing of the motor 117.

In another example embodiment, the rotor magnet temperature estimation module 104 may be replaced with a temperature detector (e.g., a thermistor and wireless transmitter like infrared thermal sensor) mounted on the rotor or the magnet, where the detector provides a signal (e.g., wireless signal) indicative of the temperature of the magnet or magnets.

In another example embodiment, the rotor magnet temperature estimation module 104 may be replaced with a back electromotive force (EMF) sensed at the known speed of the Permanent Magnet motor and indirectly estimated to indicate the temperature of the magnet or magnets.

In an example embodiment, the system may operate in the following manner. The torque command generation module 105 receives an input control data message, such as a speed control data message, a voltage control data message, or a torque control data message, over a vehicle data bus 118. The torque command generation module 105 converts the received input control message into torque control command data T_cmd.

The d-q axis current generation manager 109 selects or determines the direct axis current command and the quadrature axis current command associated with respective torque control command data and respective detected motor shaft 126 speed data SD. For example, the d-q axis current generation manager 109 selects or determines the direct axis current command and the quadrature axis current command by accessing one or more of the following: (1) a look-up table, database or other data structure that relates respective torque commands to corresponding direct and quadrature axes currents, (2) a set of quadratic equations or linear equations that relate respective torque commands to corresponding direct and quadrature axes currents, or (3) a set of rules (e.g., if-then rules) that relates respective torque commands to corresponding direct and quadrature axes currents. The sensor 115 on the motor 117 facilitates provision of the detected speed data SD for the motor shaft 126, where the primary processing module 114 may convert raw position data provided by the sensor 115 into speed data SD.

The current adjustment module 107 (e.g., d-q axis current adjustment module) provides current adjustment data to adjust the direct axis current command id_cmd and the quadrature axis current command iq_cmd based on input data from the rotor magnet temperature estimation module 104, the current shaping module 106, and terminal voltage feedback module 108.

The current shaping module 106 may determine a correction or preliminary adjustment of the quadrature axis (q-axis) current command and the direct axis (d-axis) current command based on one or more of the following factors: torque load on the motor 117 and speed of the motor 117, for example. The rotor magnet temperature estimation module 104 may generate a secondary adjustment of the q-axis current command and the d-axis current command based on an estimated change in rotor temperature, for example. The terminal voltage feedback module 108 may provide a tertiary adjustment to d-axis and q-axis current based on controller voltage command versus voltage limit. The current adjustment module 107 may provide an aggregate current adjustment that considers one or more of the following adjustments: a preliminary adjustment, a secondary adjustment, and a tertiary adjustment.

The terminal voltage feedback module 108 may further provide an additional feedback for adjustment to d-axis and q-axis current based on a terminal voltage threshold and estimates of the actual terminal voltages va, vb and vc provided by an estimation and threshold module 127, as will be described below. The estimation and threshold module 127 may further be coupled to outputs of the PWM generation module 112, which may provide the estimation and threshold module 127 with the inverter terminal voltages (va*, vb* and vc*). The estimation and threshold module 127 may estimate actual terminal voltages $v_a$, $v_b$ and $v_c$ of the inverter circuit 188 such that the inverter terminal voltages (va*, vb* and vc*) accurately resemble the actual output terminal voltages (va, vb and vc), as will be further explained below. The estimation and threshold module 127 may further provide terminal voltage threshold, as will be described further below.

In an example embodiment, the motor 117 may include an interior permanent magnet (IPM) machine or a synchronous IPM machine (IPMSM).

The sensor 115 (e.g., shaft or rotor speed detector) may include one or more of the following: a direct current motor, an optical encoder, a magnetic field sensor (e.g., Hall Effect sensor), magneto-resistive sensor, and a resolver (e.g., a brushless resolver). In one configuration, the sensor 115 includes a position sensor, where raw position data and associated time data are processed to determine speed or velocity data for the motor shaft 126. In another configuration, the sensor 115 includes a speed sensor, or the combination of a speed sensor and an integrator to determine the position of the motor shaft.

In yet another configuration, the sensor 115 includes an auxiliary, compact direct current generator that is coupled mechanically to the motor shaft 126 of the motor 117 to determine speed of the motor shaft 126, where the direct current generator produces an output voltage proportional to the rotational speed of the motor shaft 126. In still another configuration, the sensor 115 includes an optical encoder with an optical source that transmits a signal toward a rotating object coupled to the motor shaft 126 and receives a reflected or diffracted signal at an optical detector, where the frequency of received signal pulses (e.g., square waves) may be proportional to a speed of the motor shaft 126. In an additional configuration, the sensor 115 includes a resolver with a first winding and a second winding, where the first winding is fed with an alternating current, where the voltage induced in the second winding varies with the frequency of rotation of the rotor.

Figure 2:
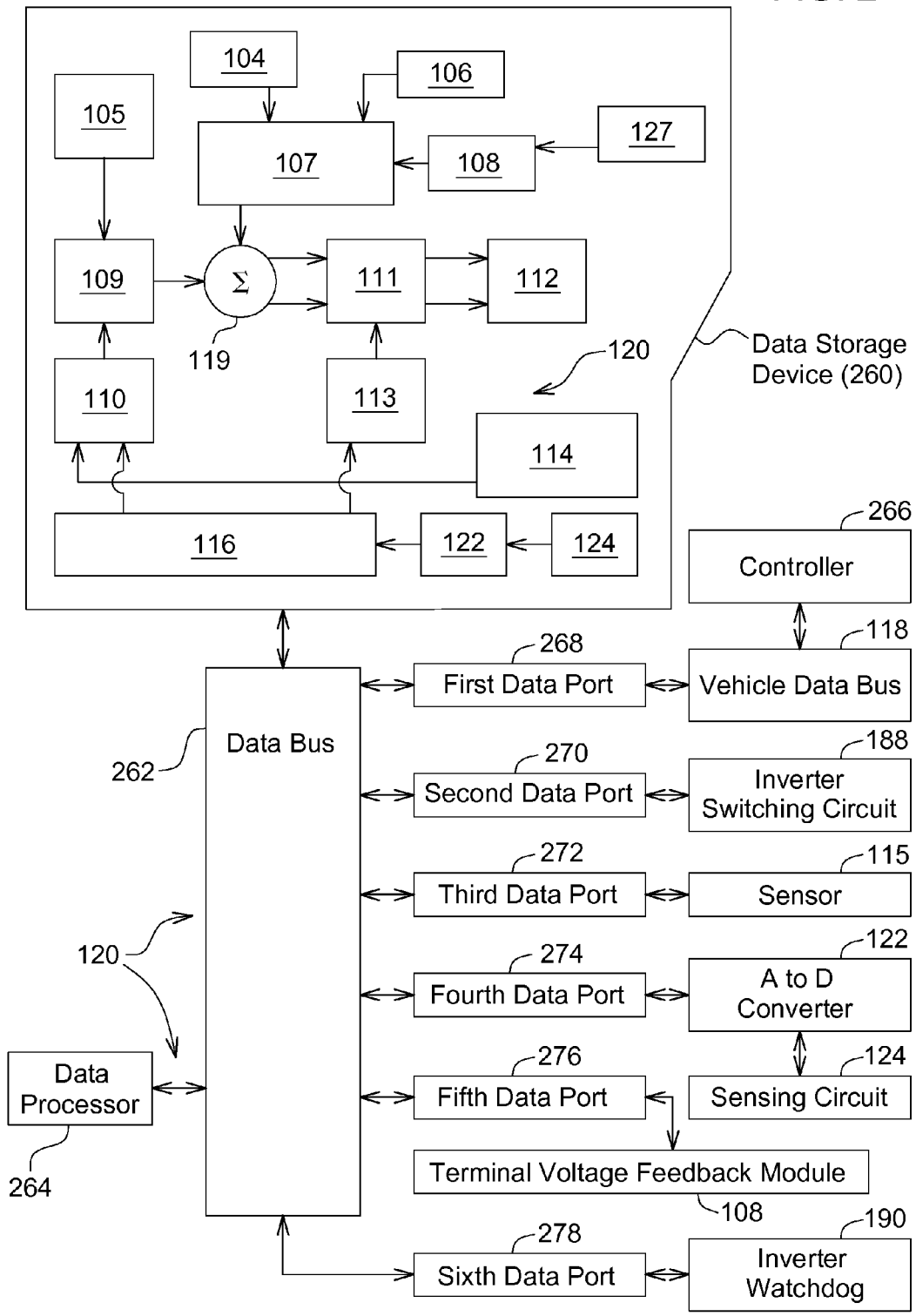

FIG. 2 is a block diagram of an electronic data processing system consistent with FIG. 1, according to an example embodiment. In FIG. 2, the electronic data processing system 120 includes an electronic data processor 264, a data bus 262, a data storage device 260, and one or more data ports (268, 270, 272, 274, 276 and 278). The data processor 264, the data storage device 260 and one or more data ports are coupled to the data bus 262 to support communications of data between or among the data processor 264, the data storage device 260 and one or more data ports.

In an example embodiment, the data processor 264 may include an electronic data processor, a microprocessor, a microcontroller, a programmable logic array, a logic circuit, an arithmetic logic unit, an application specific integrated circuit, a digital signal processor, a proportional-integral-derivative (PID) controller, or another data processing device.

The data storage device 260 may include any magnetic, electronic, or optical device for storing data. For example, the data storage device 260 may include an electronic data storage device, an electronic memory, non-volatile electronic random access memory, one or more electronic data registers, data latches, a magnetic disc drive, a hard disc drive, an optical disc drive, or the like.

As shown in FIG. 2, the data ports include a first data port 268, a second data port 270, a third data port 272, a fourth data port 274, a fifth data port 276 and a sixth data port 278. While in FIG. 2, 6 data ports are shown, any suitable number of data ports may be used. Each data port may include a transceiver and buffer memory, for example. In an example embodiment, each data port may include any serial or parallel input/output port.

In an example embodiment as illustrated in FIG. 2, the first data port 268 is coupled to the vehicle data bus 118. In turn, the vehicle data bus 118 is coupled to a controller 266. In one configuration, the second data port 270 may be coupled to the inverter circuit 188; the third data port 272 may be coupled to the sensor 115; the fourth data port 274 may be coupled to the analog-to-digital converter 122; the fifth data port 276 may be coupled to the terminal voltage feedback module 108; and the sixth data port 278 may be coupled to the inverter watchdog 190. The analog-to-digital converter 122 is coupled to the sensing circuit 124.

In an example embodiment of the data processing system 120, the torque command generation module 105 is associated with or supported by the first data port 268 of the electronic data processing system 120. The first data port 268 may be coupled to a vehicle data bus 118, such as a controller area network (CAN) data bus. The vehicle data bus 118 may provide data bus messages with torque commands to the torque command generation module 105 via the first data port 268. The operator of a vehicle may generate the torque commands via a user interface, such as a throttle, a pedal, the controller 266, or other control devices.

In one example embodiment, the PWM generation module 112 may communicate with the inverter switching circuit 188 and/or the data processor 264 via the second data port 270. In some example embodiments, the sensor 115 may communicate with the primary processing module 114 and/or the data processor 264 via the third data port 272. In one example embodiment, the analog-to-digital converter 122 may communicate with the sensing circuit 124 and/or the data processor 264 via the fourth data port 274. In one example embodiment, the terminal voltage feedback module 108 may communicate with the data processor 264 via the fifth data port 276. In one example embodiment, the inverter watchdog 190 may communicate with the degradation estimation module 130, the calculation module 110 and/or the data processor 264 via the sixth data port 278.

As described above and with reference to FIG. 1, the inverter switching circuit 188 includes a plurality of switching semiconductors such as IGBT transistors. However, the switching semiconductors are not limited to IGBT transistors but may rather be any other type of known or to be developed switching devices.

In one example embodiment, each of the switching semiconductors of the inverter switching circuit 188 may have a monitoring circuit associated therewith. Accordingly, the number of monitoring circuits of the inverter watching 190 may correspond to the number of switching semiconductors of the inverter switching circuit 188.

In one example embodiment, there may be a single monitoring circuit associated with two or more of the switching semiconductors of the inverter switching circuit 188 as opposed to a single monitoring circuit for each switching semiconductor in the inverter switching circuit 188.

The inverter watchdog 190, via the monitoring circuits included therein, generates output data such as frequency (rate), duration of overloading of the switching circuits, rate-of-rise of voltage across the switching circuits, and peak voltages across the switching circuits. The generation of the output data by the inverter watchdog 190 will be described in greater detail below with reference to FIGS. 3-8.

In one example embodiment, the generated output data is then sent to the electronic data processing system 120 (e.g., the degradation estimation module 130 of the system 120) to develop a behavioral model for the operator's expectations of the hybrid vehicle in which the electronic data processing system 120, the inverter switching circuit 188, the inverter watchdog 190 and the motor 117 are installed. The sending of the generated output data to the electronic data processing system 120 as well as the analyzing and development of behavioral model will be described in greater detail pursuant to the description of FIG. 8.

The produced data, in at least one example embodiment, is useful for predicting leftover life of the switching semiconductors in the inverter switching circuit 188 including determination of the service and maintenance schedule for the switching semiconductors of the inverter switching circuit 188. Hereinafter, IGBTs will be described as an example of switching semiconductors that may be utilized in the inverter switching circuit 188. However, example embodiments are not limited to IGBT transistors as switching semiconductors, as described above.

Figure 3:
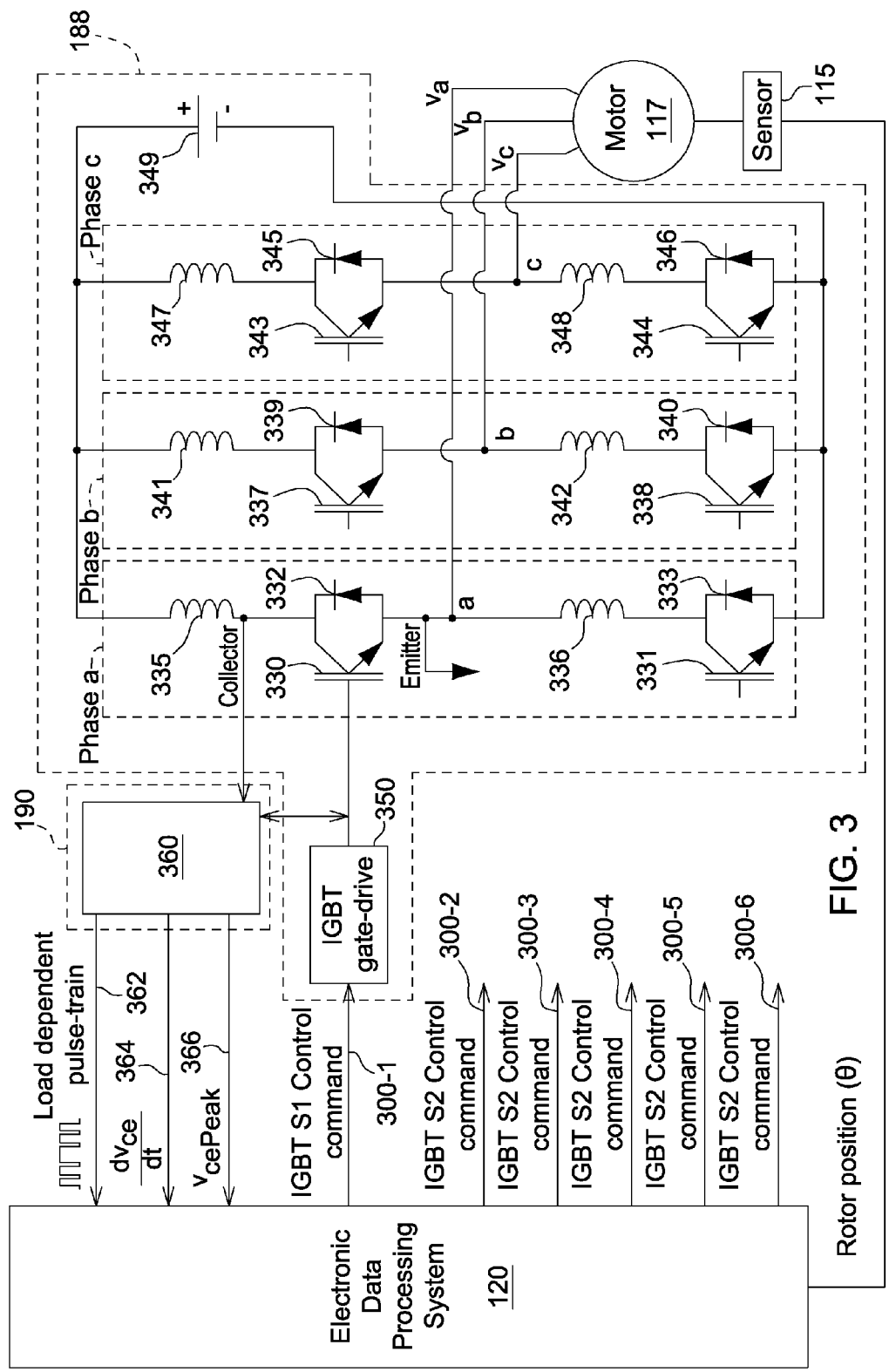

FIG. 3 illustrates an inverter circuit coupled to an inverter watchdog, according to an example embodiment. As shown in FIG. 3, the electronic data processing system 120 provides commands 300-1 to 300-6 for controlling/driving one of the switching transistors of the inverter switching circuit 188 (e.g., for controlling/driving one of the IGBT transistors 330, 331, 337, 338, 343 and 344, which will be further described below).

In one example embodiment, the inverter switching circuit 188 includes three sub-electrical assemblies, each of which forms one of three phases of the inverter switching circuit 188, namely phase a, phase b and Phase c. Each phase includes a set of components. For example, Phase a includes IGBT pair 330 and 331, diodes 332 and 333 as well as inductors 335 and 336; phase b includes IGBT pair 337 and 338, diodes 339 and 340 as well as inductors 341 and 342; and phase c includes IGBT pair 343 and 344, diodes 345 and 346 as well as inductors 347 and 348.

In one example embodiment, the diodes of each phase of the inverter switching circuit 188 shown in FIG. 3 (e.g., diodes 332 and 333 of phase a, diodes 339 and 340 of phase b and diodes 343 and 344 of phase c) provide for a smooth transition of current from one IGBT to another IGBT in a given phase of the inverter switching circuit 188, when the current switches from low to high or high to low in the given phase of the inverter switching circuit 188.

In one example embodiment, the inductors of each phase of the inverter switching circuit 188 shown in FIG. 3 (e.g., inductors 335 and 336 of phase a, inductors 341 and 342 of phase b and inductors 347 and 348 of phase c) enable elimination of the inductance power of a bus included in the corresponding IGBT in each phase as well as the inductance power of the DC bus connecting the corresponding IGBT with the direct current (DC) power supply 349. In one example embodiment, the inductance power of the bus within each IGBT as well as the DC bus is due to such busses being made of copper.

In one example embodiment, the inverter switching circuit 188 also includes a DC power supply 349 for supplying positive or negative voltages to each of the IGBTs 330, 331, 337, 338 and 343 and 344 while one or more IGBTs 330, 331, 337, 338, 343 and 344 are on. In one example embodiment, the DC power supply 349 may be any known or to be developed DC power supply, including but not limited to, a capacitor bank having sufficient charge stored for charging the inverter switching circuit 188, a battery pack, or any other means for storing energy in DC form.

In one example embodiment, the inverter switching circuit 188 further includes a gate-drive circuit 350 (an IGBT gate-drive circuit when the switching semiconductors are IGBTs), which may control the operation of turning on/off the IGBTs of the inverter switching circuit 188. While not shown in FIG. 3, in one example embodiment, each IGBT (switching semiconductor) of the inverter switching circuit 188 may have a corresponding gate-drive circuit such as the gate-drive circuit 350.

The operation of the switching inverter circuit 188 and the components included therein are known to those skilled in the art. Therefore, for the sake of brevity a description of how the inverter switching circuit 188 operates, is omitted.

In one example embodiment, the inverter switching circuit 188, at points labeled a, b and c, provides the three-phase voltages $V_a$, $V_b$ and $V_c$ for driving the machine 117. Furthermore and as described above, the motor 117 is coupled to the sensor 115, which provides various sensed parameters such as rotor position to the electronic data processing system 120.

Further shown in FIG. 3, is the inverter watchdog 190, described above. In one example embodiment, the inverter watchdog 190 includes a monitoring circuit 360. While only one monitoring circuit 360 is shown in FIG. 3, as described above, each switching semiconductor (e.g., each of IGBTs 330, 331, 337, 338, 343 and 344) of the inverter switching circuit 188 may have a corresponding monitoring circuit in the inverter watchdog 190. The operation of the monitoring circuit 190 will be further described below with reference to FIG. 4.

In one example embodiment, each monitoring circuit, such as the monitoring circuit 360, produces a series of outputs such as outputs 362, 364 and 366, corresponding to a pulse-train, rate of change of voltage across the IGBT and the peak voltage across the IGBT as monitored by the monitoring circuit 360, respectively. The outputs 362, 364 and 366 will be further described below.

In one example embodiment, the monitoring circuit 360 provides the outputs 362, 364 and 366 to the electronic data processing system 120, for further processing and analysis, as will be described below pursuant to the description of FIG. 8.

Hereinafter, operations of a single monitoring circuit of the monitoring watchdog 190 (e.g., the monitoring circuit 360) and a switching semiconductor monitored by the monitoring circuit 360 (e.g., the IGBT 330) will be described. It is noted that the same operation is equally applicable to any other monitoring circuit of the monitoring watchdog 190 and its corresponding switching semiconductor (e.g., IGBT transistor).

Figure 4:
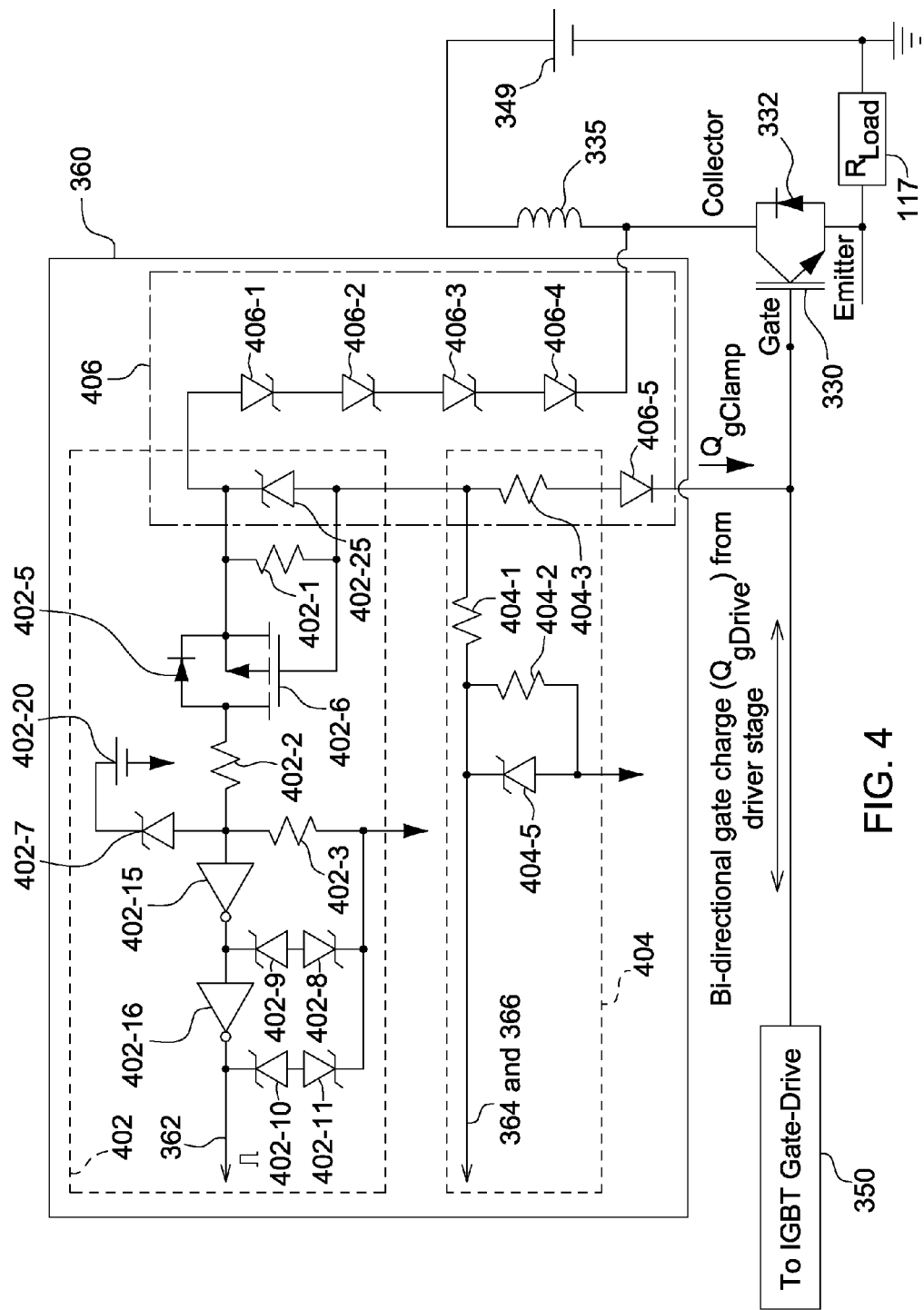

FIG. 4 illustrates a monitoring circuit and a switching semiconductor, according to one example embodiment. In FIG. 4, the IGBT 330 and the associated components (diode 332, inductor 335, DC voltage source 349 as well as the load (motor) 117) are shown, the operation of which is known and thus will be not be further described, for the sake of brevity.

Furthermore, FIG. 4 illustrates the monitoring circuit 360, described above with reference to FIG. 3. In one example embodiment, the monitoring circuit 360 includes 3 sub-circuits 402, 404 and 406.

The first sub-circuit 402 includes various components such as resistors 402-1 to 402-3, diodes 402-5 and 402-7 to 402-11, P-channel MOSFET 402-6, inverters 402-15 and 402-16 and the DC voltage source 402-20. In one example embodiment, a combination of the diode 402-5 and P-channel MOSFET 402-6 is referred to as a PMOSFET. The first sub-circuit 402 also includes a diode 402-25, which is commonly shared between the first sub-circuit 402 and the third sub-circuit 406. In one example embodiment, the output of the first sub-circuit 402 is the pulse train 362, described above with reference to FIG. 3.

As is known in the art, an inverter switching circuit such as the inverter switching circuit 188 operates at speeds ranging from a sub-kilo hertz to hundreds of kilo hertz per second. Also, switching devices (e.g. IGBTs 330, 331, 337, 338, 343, and 344) of inverter switching circuit 188 operate (turn-on and turn-off) to change state (ON to OFF and vice-versa) in nano-seconds to micro-second. This means that each of the IGBTs 330, 331, 337, 338, 343 and 344 of the inverter switching circuit 188, shown in FIG. 3, turn on and/or off numerous number of times (depending on the operating frequency) each second (e.g., the gate-drive circuit (e.g., the gate-drive circuit 350) associated with each IGBT controls the gate voltage ($v_{ge}$) of the IGBT to turn the IGBT on or off). An IGBT may be turned-off with significant over-voltage when the IGBT supplies full (peak) current (e.g., 100% of the load current or near-full (near-peak) current (e.g., equal to or greater than 80% of the load current) to the load 117.

In one example embodiment, every time an IGBT is turned off (e.g., IGBT 330), the first sub-circuit 402 produces (generates) a pulse (or a pulse train) as the output 362 and the second sub-circuit 404 produces (generates) a rate of rise in the collector-emitter voltage across the IGBT 330 as output 364, and the peak collector-emitter voltage across the IGBT 330 as the output 366. Accordingly, through the interaction of the components of the first sub-circuit 402 identified above, every time the IGBT 330 is turned off, the first sub-circuit 402 produces a pulse or a pulse train from which the frequency and a duration of overloading of the IGBT 330 may be determined. An example of such pulse train and the generation thereof will now be described with reference to FIGS. 4 and 5.

In one example embodiment, when the IGBT 330 turns off at near-full load, at full load or above (e.g., greater than 100% load) full load, the IGBT 330 turns off with over-voltage. In one example embodiment, the value of over-voltage is determined as a sum of two terms. The first term is the voltage across the DC power supply 349. The second term is the product of the inductance of the inductor 335 and a falling rate of change of current through the IGBT 330

$$\left(\frac{di_{igbt}}{dt}\right).$$

In one example embodiment, if the over-voltage value of the IGBT 330 exceeds the break-down voltage of the diode chains consisting of transient voltage suppressor (TVS) diodes 406-1 to 406-4 and 402-25 of the circuit 406, current will flow from the collector terminal of the IGBT 330 to the gate terminal of IGBT 330 via the path consisting of diodes 406-4, 406-3, 406-2, 406-1, 402-25, the resistor 404-3, and the diode 406-5. As current is flowing from the collector terminal of the IGBT 330 to the gate terminal of the IGBT 330 during a turn-off event of IGBT 330, voltage developed across the diode 402-25 causes PMOSFET (anti-parallel diode 402-5 and P-channel MOSFET 402-6 of the first sub-circuit 402) to turn-on. Accordingly, the output of the resistors 402-2 and 402-3 connected at the drain terminal of PMOSFET develops voltage across the resistor 402-3 that creates a logic-low output at the output of the inverter 402-15 and a logic-high output at the output of the inverter 402-16. Therefore, whenever a turn-off event of the IGBT 330 occurs while the IGBT 330 is carrying current above 80% of the load, the pulse train 362 is at logic high, which is otherwise at logic low. Therefore, the first sub-circuit 402 generates a pulse-train consisting of a logic-high output whenever the IGBT 330 turns-off at near-full, full and above full current (>100% load) values.

In one example embodiments, the diodes 402-7, 402-8, 402-9, 402-10 and 402-11 of the first sub-circuit 402 are protection diodes to ensure that inverters 402-15 and 402-16 are protected for any over-voltage due to extreme operating conditions of the third sub-circuit 406 including diodes 406-4, 406-3, 406-2, 406-1, 402-25 and 406-5 as well as the resistor 404-3. In one example embodiment, the extreme operating condition is more than 10 Ampere current flowing through the diodes 406-4, 406-3, 406-2, 406-1, 402-25 and 406-5 and resistor 404-3 chain.

Figure 5:
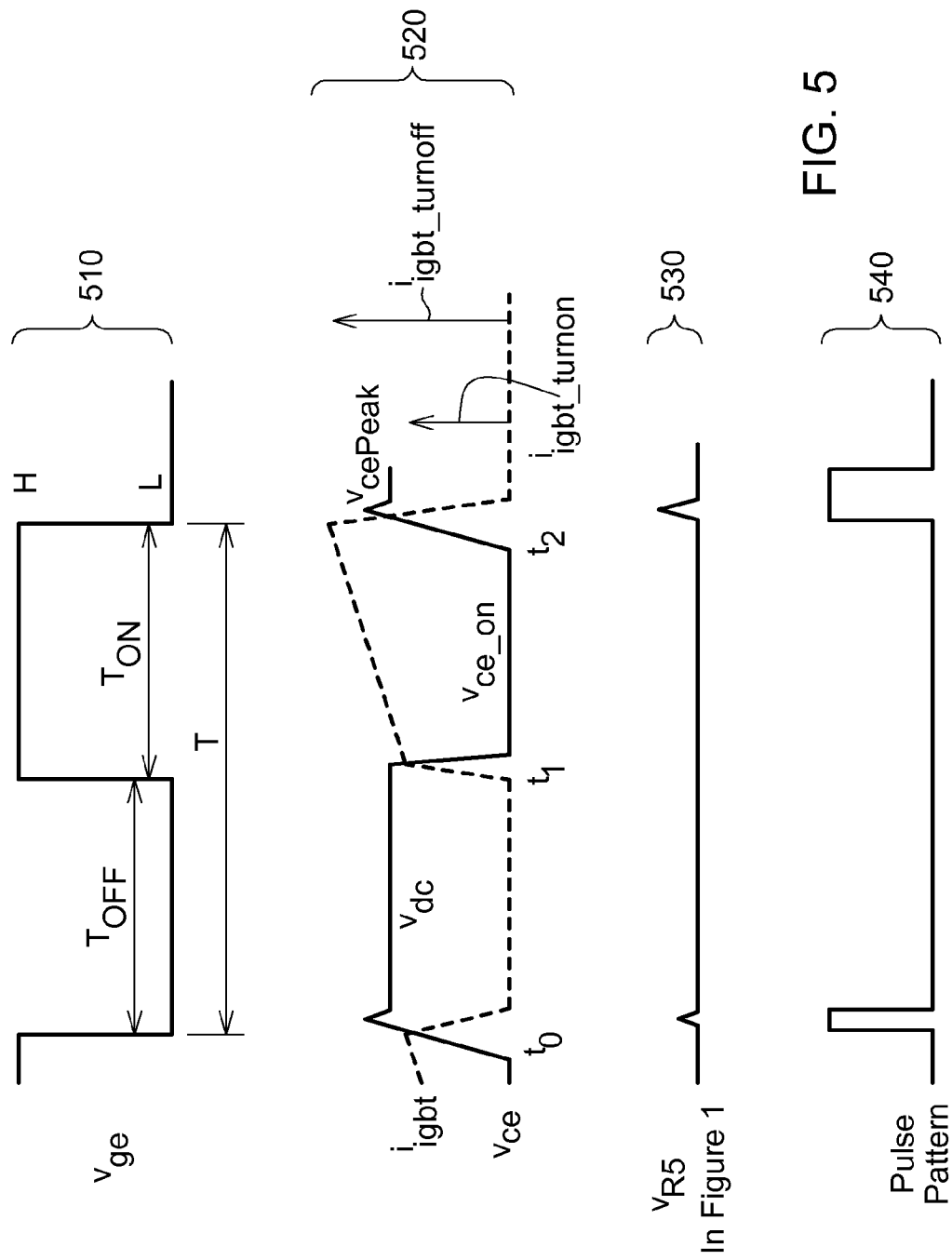

FIG. 5 illustrates the generation of outputs of a monitoring circuit, according to one example embodiment. In FIG. 5, the first graph 510 illustrates one on/off period T of the IGBT 330. The IGBT 330 is turned on or off by controlling (via the IGBT gate-drive 350) the gate voltage ($v_{ge}$) of the IGBT 330. $T_{off}$ represents a period during which the IGBT 330 is turned off (IGBT 330 switches from high H to low L) and $T_{on}$ represents a period during which the IGBT 330 is turned on (IGBT 330 switches from low L to high H).

Furthermore, in FIG. 5, the second graph 520 illustrates the behavior of the current flowing through the IGBT 330 ($i_{igbt}$) and the collector-emitter voltage of the IGBT 330 ($v_{ce}$). As can be seen from the graph 520 and in one example embodiment, at the beginning of $T_{off}$, $v_{ce}$ increases while $i_{igbt}$ decreases, whereas at the end of $T_{off}$ and the beginning of $T_{on}$, $v_{ce}$ drops while $i_{igbt}$ increases. In other words, $i_{igbt}$ follows the same trajectory as $v_{ge}$ while $v_{ce}$ follows an inverse trajectory compared to $i_{igbt}$ and $v_{ge}$.

Moreover, in FIG. 5, the third graph 530 illustrates the voltage across the resistor 404-2 of the second sub-circuit 404 (which will be further described below). As can be seen from the third graph 530, the voltage across the resistor 404-2 of the second sub-circuit 404 is zero except when there is a rise in the collector-emitter voltage $v_{ce}$ in the second graph 520. Furthermore, the magnitude of the non-zero voltage values across the resistor 404-2 of the second sub-circuit 404 is proportional to the magnitude of $v_{ce}$ every time the IGBT 360 is turned off.

Finally, the output 362 (e.g., the pulse train) of the first sub-circuit 362 is shown in the fourth graph 540 of FIG. 5. As can be seen from the fourth graph 540, a pulse is generated for every non-zero voltage across the resistor 404-2 and that the width of each generated pulse is proportional to the magnitude of the voltage across resistor 404-2 of the second sub-circuit 404.

Referring back to FIG. 4, the monitoring circuit 360 further includes a second sub-circuit 404. The second sub-circuit 404 includes components such as the resistors 404-1 to 404-3, and a diode 404-5. In one example embodiment, the second sub-circuit 404 generates the output 364 (the rate of rise in the voltage $v_{ce}$) and the output 366 (the peak value of $v_{ce}$) as follows.

As described above with reference to the first sub-circuit 402, if the over-voltage value of the IGBT 330 exceeds the break-down voltage of the diode chains consisting of transient voltage suppressor (TVS) diodes 406-1 to 406-4 and 402-25 of the circuit 406, current will flow from the collector terminal of the IGBT 330 to the gate terminal of IGBT 330 via the path consisting of diodes 406-4, 406-3, 406-2, 406-1, 402-25, the resistor 404-3, and the diode 406-5. This flow of current causes voltage drop across the resistor 404-3. This voltage is divided using resistor combination 404-1 and 404-2. The diode 404-5 ensures that the output of watch-dog circuit 404 remains within bound that is readable by the electronic data processing system 120 without any damages thereto. Value of the voltage across the resistor 404-2 and rate of rise of voltage across the resistor 404-2 constitute the outputs 366 and 364, respectively. The value of the voltage across the resistor 404-2 and rate of rise of voltage across the resistor 404-2 represent the peak value of IGBT 330 voltage ($v_{ce}$) and the rate of rise in the voltage across IGBT 330

$$\left(\frac{dv_{ce}}{dt}\right),$$

respectively.

In one example embodiment, the second sub-circuit 404 determines the output 364 as shown by the graph 520 and/or graph 530 in FIG. 5. In one example embodiment, the second sub-circuit 404 determines the peak value of $v_{ce}$ as shown by the graph 520 in FIG. 5.

The monitoring circuit 360 further includes a third sub-circuit 406 that, in one example embodiment, operates as an over-voltage protection circuit for the IGBT 330. The third sub-circuit 406 includes component such as diodes 406-1 to 406-5. In one example embodiment, the third sub-circuit 406 may function as follows.

As described above with reference to the first sub-circuit 402, when IGBT 330 turns off at near-full load, at full load or above (e.g., greater than 100% load) full load, the IGBT 330 turns off with over-voltage. In one example embodiment, the value of over-voltage is determined as a sum of two terms. The first term is the voltage across the DC power supply 349. The second term is the product of the inductance of the inductor 335 and falling rate of change of current through the IGBT 330

$$\left(\frac{di_{igbt}}{dt}\right).$$

In one example embodiment, if the over-voltage value of the IGBT 330 exceeds the break-down voltage of the diode chains consisting of transient voltage suppressor (TVS) diodes 406-1 to 406-4 and 402-25 of the circuit 406, current will flow from the collector terminal of the IGBT 330 to the gate terminal of IGBT 330 via the path consisting of diodes 406-4, 406-3, 406-2, 406-1, 402-25, the resistor 404-3, and the diode 406-5.

In one example embodiment, current that flows from the collector terminal to the gate terminal of IGBT 330, charges the gate terminal of the IGBT 330 to above the threshold voltage of the IGBT 330 gate voltage ($v_{ge}$), thus turning the IGBT 330 back on and stopping the turn-off process of the IGBT 330 for few nanoseconds, for example, 40 nanoseconds to about 200 nanoseconds depending on the load. The higher the load, the higher would be the duration of stopping the IGBT 300 turn-off process. Therefore, the gate-charge current flowing through the path consisting of diodes 406-4, 406-3, 406-2, 406-1, 402-25, the resistor 404-3, and the diode 406-5, produces an IGBT voltage snubbing effect, resulting in over-voltage protection of the IGBT 330. In one example embodiment, this over-voltage protection capability of the third sub-circuit 406 does not allow the voltage of the IGBT 330 to exceed beyond its corresponding rated value and keeps the voltage of the IGBT 330 within the safe-operating area (SOA), as dictated by the specifications of the IGBT 330.

Upon generation of the outputs 362, 364 and 366, as described above, in one example embodiment, each monitoring circuit of the inverter watchdog 190 sends the corresponding generated outputs 362, 364 and 366 to the electronic data processing system 120. From the received output data, the electronic data processing system 120 determines frequency and duration of overloading of each IGBT (which is an example of a switching semiconductor) of the inverter switching circuit 188. In one example embodiment, the electronic data processing system 120 further develops a behavioral model based on the received output data, according to which the motor 117 is driven. In one example embodiment, the electronic data processing system 120 also develops a maintenance schedule for scheduling and performing maintenance of the switching semiconductors of the inverter switching circuit 188. The operation of determining the frequency and duration of overloading of the switching semiconductors and/or developing the various mentioned models, will be further described below pursuant to the description of FIG. 8.

Having described the operation of the monitoring circuit 360, hereinafter examples of various forms of the output 362 under various load conditions according to which the motor 117 is driven, will be described.

Figure 6:
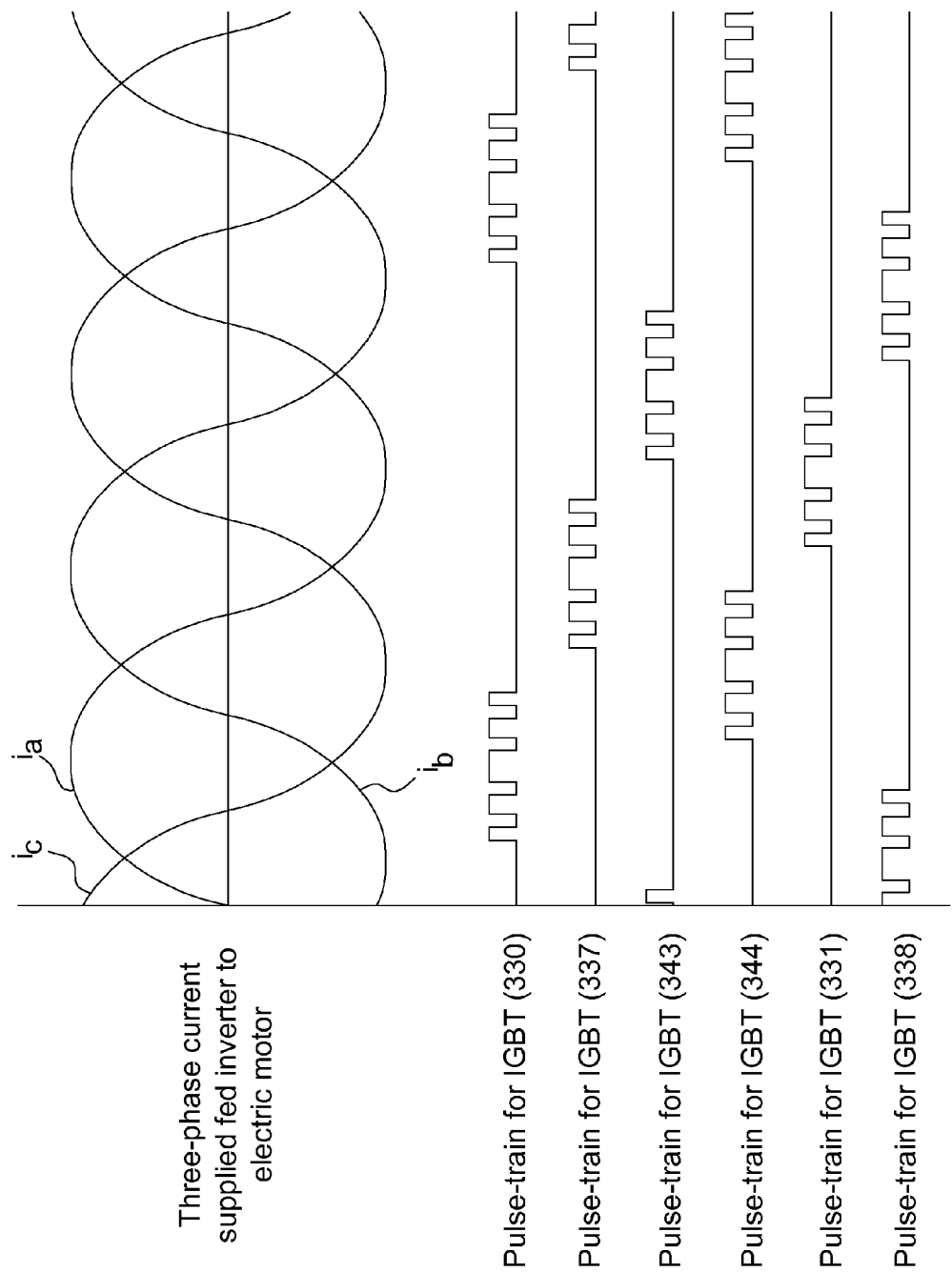
FIG. 6 illustrates pulse trains generated by monitoring circuits of a monitoring watchdog that monitor switching semiconductors when a motor is driven under relatively light load conditions, according to one example embodiment.

FIG. 6 illustrates pulse trains generated by monitoring circuits of a monitoring watchdog that monitor switching semiconductors when a motor is driven under relatively light load conditions, according to one example embodiment.

As shown in FIG. 6, a monitoring circuit such as the monitoring circuit 360 produces a pulse train (output 362) for each IGBT connected to the monitoring circuit. Given, the 6 IGBTs 330, 331, 337, 338, 343 and 334 of the inverter switching circuit 188, FIG. 6 illustrates 6 different pulse trains for the 6 IGBTs. Furthermore, FIG. 6 also illustrates the three-phase currents $i_a$, $i_b$ and $i_c$ supplied by the inverter switching circuit 188 to the motor 117.

With reference to FIGS. 3 and 6, $i_a$ is generated using IGBTs 330 and 331. Accordingly, during the positive half cycle of $i_a$, a pulse train is generated at the output of the monitoring circuit that monitors the IGBT 330, while during the negative half cycle of $i_a$, a pulse train is generated at the output of the monitoring circuit that monitors the IGBT 331.

Similarly, during the positive half cycle of $i_b$, a pulse train is generated at the output of the monitoring circuit that monitors the IGBT 337, while during the negative half cycle of $i_b$, a pulse train is generated at the output of the monitoring circuit that monitors the IGBT 338.

Similarly, during the positive half cycle of $i_c$, a pulse train is generated at the output of the monitoring circuit that monitors the IGBT 343, while during the negative half cycle of $i_c$, a pulse train is generated at the output of the monitoring circuit that monitors the IGBT 344.

As can be seen from the output pulse trains for each phase of the current, as each phase current reaches a maximum or a minimum value, the width of the corresponding generated pulses increases.

Figure 7:
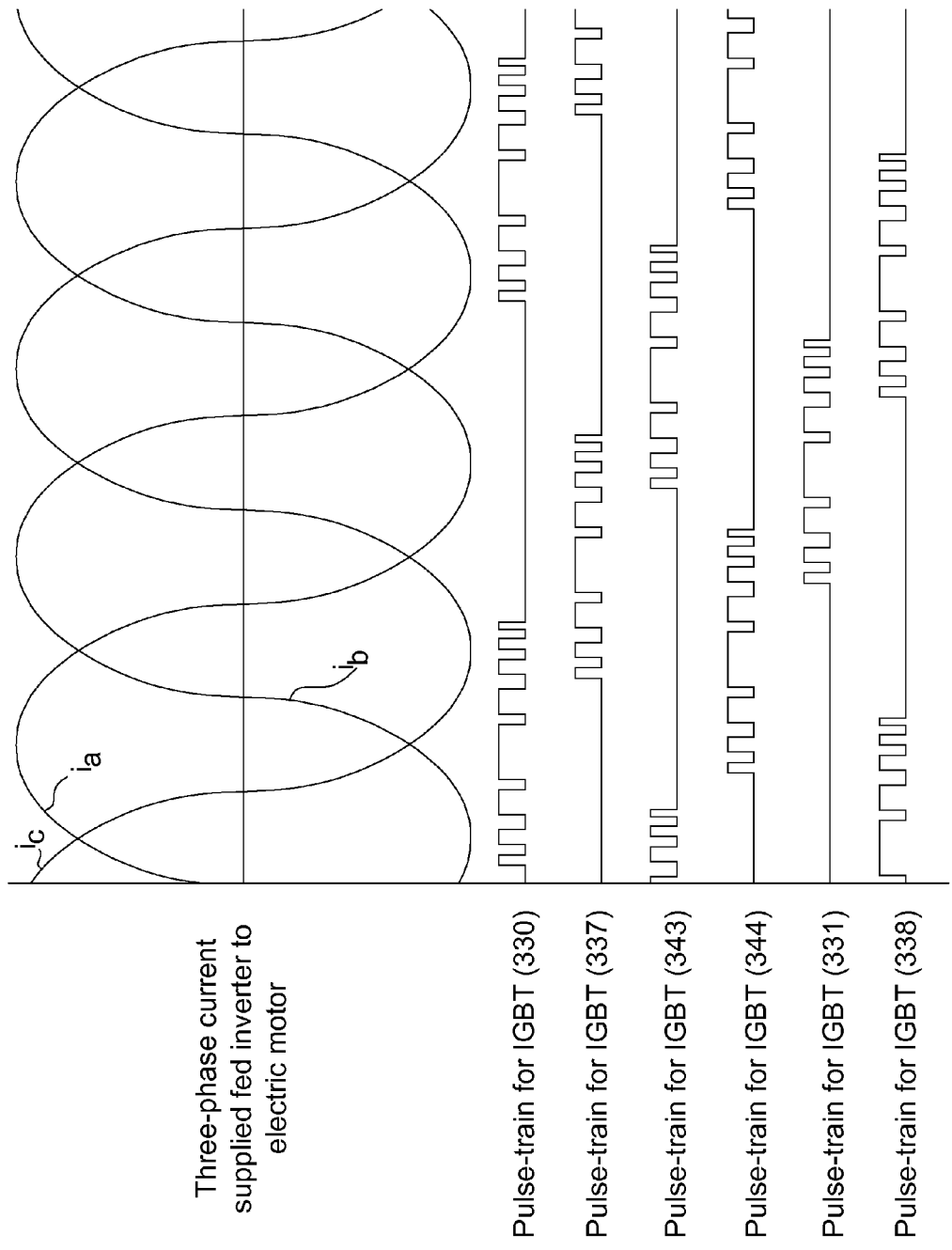
FIG. 7 illustrates pulse trains generated by monitoring circuits of a monitoring watchdog that monitor switching semiconductors, when a motor is driven under more extreme load conditions relative to FIG. 6, according to one example embodiment.

FIG. 7 illustrates pulse trains generated by monitoring circuits of a monitoring watchdog that monitor switching semiconductors, when a motor is driven under more extreme load conditions relative to FIG. 6, according to one example embodiment.

As shown in FIG. 7, a monitoring circuit such as the monitoring circuit 360 produces a pulse train (output 362) for each IGBT connected to the monitoring circuit. Given, the 6 IGBTs 330, 331, 337, 338, 343 and 334 of the inverter switching circuit 188, FIG. 7 illustrates 6 different pulse trains for the 6 IGBTs. Furthermore, FIG. 7 also illustrates the three-phase currents $i_a$, $i_b$ and $i_c$ supplied by the inverter switching circuit 188 to the motor 117.

The association between $i_a$, $i_b$ and $i_c$ and the pulse trains generated by the monitoring circuits for the 6 IGBTs are similar to that described above with reference to FIG. 6, except that the periodicity and the peak values of $i_a$, $i_b$ and $i_c$ in FIG. 7 is different compared to FIG. 6, as the motor 117 is driven under more extreme conditions (more torque is commanded by an operator of the motor 117) compared to FIG. 6. Therefore, the pulse trains generated by the monitoring circuits are also different in both periodicity and width, compared to the corresponding pulse trains generated in FIG. 6, where the motor 117 is driven under relatively lighter loading conditions.

FIG. 8 illustrates pulse trains generated by monitoring circuits of a monitoring watchdog that monitor switching semiconductors, when a motor is driven under stall conditions, according to one example embodiment.

In one example embodiment, when the inverter-fed motor 117 gets stalled, an operator of the motor 117 commands exceedingly high-torque to exit such stall condition. For example, when a vehicle is working under over-load conditions, to get high torque at a given power (Power=Torque*Speed in rad/sec) of the inverter switching circuit 188, the motor speed drops to zero or very close to zero. Accordingly, under stall conditions only three IGBTs of the inverter switching circuit 188 may be switching between on and off states in order to support the exceedingly high-torque commanded by the operator. Under stall conditions, one of the IGBTs (e.g., one among IGBTs 330, 337 and 343) connected to positive side of the DC voltage 349 of the inverter switching circuit 188, shown in FIG. 3, supplies peak load current to the motor 117 and two non-complimentary IGBTs (e.g., IGBTs 338 and 344) connected to the negative side of the DC voltage 349 of the inverter switching circuit 188 supply half of the peak load current to the load 117.

As shown in FIG. 8, IGBT 330 (phase a IGBT connected to the positive side of the DC voltage 349), IGBT 344 (phase c IGBT connected to the negative side of the DC voltage 349), and IGBT 338 (phase b IGBT connected to the negative side of the DC voltage 349) switch to support peak torque so that operator could pull out the vehicle from stall condition. Under stall conditions pulse pattern for remaining three IGBTs (IGBTs 331, 337 and 343) are not generated.

Accordingly, as shown in FIG. 8, no corresponding output (pulse train) is generated by the monitoring circuits for the IGBTs 331, 337 and 343.

Therefore in one example embodiment, the inverter watchdog 190, using the examples of generated pulse trains of FIG. 8, identifies whether the vehicle has entered into stall condition, how-long the vehicle remained in the stall condition and/or how frequent the vehicle enters into stall conditions. This information may then be used to develop a unique signature and behavior model associated with each operator of the vehicle.

Having described the generation of outputs 362, 364 and 366 by the corresponding monitoring circuits of the inverter watchdog 190 for each switching semiconductor of the inverter switching circuit 188, hereinafter the process of using the outputs 362, 364 and 366 in order to determine frequency and duration of overloading the switching semiconductors and/or develop a behavioral model of driving a particular motor/vehicle will be described. Furthermore, a description of developing a maintenance schedule for switching semiconductors of the inverter switching circuit 188 will also be described.

Referring back to FIG. 3, in one example embodiment, the outputs 362, 364 and 366 are provided (e.g., send or transmitted using known or to be developed methods) to the electronic data processing system 120. The electronic data processing system 120, through the degradation estimation module 130 or a processor that executes computer-readable instructions (saved on a memory associated with the electronic data processing system 120) for the degradation estimation module 130, receives the outputs 362, 364 and 366.

In one example embodiment, using the generated pulses provided as the output 362, the electronic data processing system 120 determines the frequency of driving the motor 117 under light conditions, relatively higher loading conditions and/or stall conditions. Accordingly, the electronic data processing system 120 also determines a frequency and duration of overloading the switching semiconductors of the inverter switching circuit 188.

In one example embodiment, one stall condition is counted as one event having duration and magnitude of torque commended by vehicle operator to come out of stall condition. There would be numerous such events in day if vehicle operator is not skillful and experienced compared to a number of such events if vehicle operator is skillful and experienced. Similarly, in one example embodiment, a counter may be created to keep track of how many near-full, full and above full load events each operator causes in a given day while operating a vehicle at the job site (for example, a front end loader for moving material at a construction site).

In one example embodiment, the electronic data processing system 120 may utilize a table that characterizes the over-voltage of the IGBT 330, the peak voltage of $v_{ce}$ (output 366) and the generated pulse pattern(s) (output 362), to determine a stress pattern for the IGBT 330.

Furthermore, in one example embodiment, the electronic data processing system 120 estimates the temperature of each of the switching semiconductors of the inverter switching circuit 188 based on the outputs 364 and 366 received from a corresponding monitoring circuit of the inverter watchdog 190 that monitors each switching semiconductor. For example, based on the outputs 362 and 366 (e.g., rate of rise of $v_{ce}$ and the peak value of $v_{ce}$) received from the monitoring circuit 360, the electronic data processing system 120 estimates the temperature of the IGBT 330 during a turn-off event of the IGBT 330. For example, the electronic data processing system 120 may use a table or a pre-characterized table. This table, in one example embodiment, is three-dimensional with pre-characterized relationship among four parameters of the IGBT 330, wherein, the rate of rise in the IGBT 330's voltage ($v_{ce}$), peak value of IGBT 330's voltage ($v_{ce\_peak}$), inverter switching circuit 188's coolant temperature ($T_{Coolant}$) as inputs to table and the junction temperature ($T_{Jigbt}$) of the IGBT 330 as output of three-dimensional table. Therefore, for each rate of rise in $v_{ce}$ (output 364) of the IGBT 330 and the pulse train (output 362) of the IGBT 330, a look up table is referenced to look up the estimated value of the junction temperature of the IGBT 330.

From the estimated temperature of the IGBT 330 and the stress pattern of the IGBT 330, the electronic data processing system 120 may develop a behavior model for how the motor 117 is driven. Subsequent to the behavior model, the electronic data processing system 120 may also determine a degradation model for each IGBT of the inverter switching circuit 188.

In one example embodiment, the electronic data processing system 120 may determine the degradation model for the IGBT 330 based on the fact that the higher the estimated temperature of the IGBT 330 is, for a given coolant temperature, the greater the degradation of the IGBT 330 would be. Therefore, the higher the frequency of stall conditions according to which the motor 117 is driven (obtained from the stress model for the IGBT 330), the faster the degradation of the IGBT 330 would be.

Based on the degradation model and the vehicle maintenance schedule look-up table that characterizes a relationship between a degradation of a transistor and the required maintenance, the electronic data processing system 120 may determine the schedule for performing the maintenance of one or more of the IGBTs of the inverter switching circuit 188.

Example embodiments described above provide for generation of various outputs by monitoring circuits that monitor each switching semiconductor in an inverter switching circuit that drives a load. Furthermore, example embodiments described above provide for using the generated outputs, to analyze and develop behavior models for driving a load as well as a degradation model for the switching semiconductors of the inverter switching circuit as well as a maintenance schedule for performing a maintenance on each of the switching semiconductors.

Some of the advantages of the example embodiments described above are as follows. The inverter watchdog is fast, accurate and works well (as evidenced by laboratory tests) during steady-state and transient operating conditions of inverter fed electric motors/generators.

To assess load dependent damage in an inverter IGBT, the inverter watchdog does not use current measured by any conventional current sensor, therefore, error caused by current sensor is eliminated including any temperature related drift in measurement of current by conventional sensors such as Hall effect very commonly used in electric drives.

This inverter watchdog works well over the operating temperature range (−40° C. to 175° C.) of IGBT junction.

Since the inverter watchdog is also used to snub IGBT over-voltage during turn-off events (using the third sub-circuit 406 described above), in one example embodiment, the dual use of monitoring circuits does not add any appreciable incremental cost. There is no additional cost needed to implement the proposed temperature sensing scheme, as described above.

In one example embodiment, the current flowing through the resistor 404-3 of the second sub-circuit 404 for purposes of determining the outputs 364 and 366, makes a system optimized for lowest switching losses therefore, implementation of proposed sensing scheme makes an inverter efficient as over-voltage across IGBT is less than 200 nanosecond.

The inverter watchdog, in one example embodiment, predicts IGBT junction temperature during turn-off events, which reveals how hot IGBT becomes while operator is driving a motor under normal, heavy and/or stall conditions.

In one example embodiment, data produced by the proposed inverter watchdog is useful to develop behavior model of operator and operator expectation.

In one example embodiment, operator behavior model is useful to develop fuel consumption model of a vehicle. For example, it is likely that an operator who stalls vehicle more often is likely to use more fuel per ton material handled as compared to an operator who infrequently drives the vehicle under stall conditions.

In one example embodiment, the proposed inverter watchdog offers strategic advantages to manufacturers. For example, a manufacturer, using the data generated by inverter watchdog and the developed behavior model, may provide trainings to operators so that operators for using vehicles with reduced fuel consumption and less maintenance requirements while doing the same amount of work.

In one example embodiment, the behavior model reveals how an operator performs during test drives of a vehicle and what improvements the operator may implement to increase productivity and vehicle life-time while reducing fuel consumption.

The inverter watchdog assumes that the driven load is a Permanent Magnet (PM) and Induction motors driven by standard inverter made of six power semiconductor modules or devices. Since the inverter watchdog is based on IGBT level, the inverter watchdog may also be extended to cover Switched Reluctance (SR) and PM Brushless DC (PM BLDC) electric motors.

Example embodiments being thus described, it will be obvious that the same may be varied in many ways. Such variations are not to be regarded as a departure from the spirit and scope of example embodiments, and all such modifications as would be obvious to one skilled in the art are intended to be included within the scope of the claims.

The patent claims filed with the application are formulation proposals without prejudice for obtaining more extensive patent protection. The applicant reserves the right to claim even further combinations of features previously disclosed only in the description and/or drawings.

What is claimed is:
1. A circuit comprising:
   a first sub-circuit configured to generate first data corresponding to a frequency and a duration of overloading of a transistor in an inverter; and
   a second sub-circuit configured to generate second data corresponding to a rate of rise of a voltage and a peak voltage value of the transistor in the inverter; wherein
   the first sub-circuit and the second sub-circuit are configured to respectively provide the first data and second data as outputs to a controller for analyzing a manner in which a load coupled to the inverter is driven, and
   the controller is configured to analyze the manner in which the load is driven by,
      receiving the first data, and determining the frequency and the duration of overloading the transistor based on frequencies and widths of pulses included in the first data.

2. The circuit of claim 1, wherein the first sub-circuit is configured to generate the first data during a turn-off event of the transistor.

3. The circuit of claim 2, wherein the turn-off event takes place when the transistor supplies peak current or near-peak current to the load.

4. The circuit of claim 2, wherein the first data is a series of pulses.

5. The circuit of claim 1, wherein the second sub-circuit is configured to generate the second data during a turn-off event of the transistor.

6. The circuit of claim 1, wherein the second sub-circuit is configured to generate the second data by measuring a voltage across a resistor in the second sub-circuit.

7. The circuit of claim 1, wherein the controller is further configured to analyze the manner in which the load is driven by,
receiving the second data,
determining, based on the second data, a temperature of the transistor during a turn-off event,
developing a degradation model for the transistor based on the determined temperature, and
determining a schedule for performing a maintenance of the transistor based on the degradation model and a maintenance look-up table.

8. The circuit of claim 1, further comprising:
a third sub-circuit coupled to the first and second sub-circuits, the third sub-circuit being configured to operate as an over-voltage protection for the transistor.

9. The circuit of claim 1, wherein the transistor is one of an Insulated-Gate Bipolar Transistor (IGBT), a metal-oxide Semiconductor Field-Effect Transistor (MOSFET), a Silicon Carbide MOSFET or a Silicon Carbide IGBT.

10. A system comprising:
a plurality of transistors forming an inverter; and
a plurality of circuits, each of the plurality of circuits being coupled to one of the plurality of transistors, each of the plurality of circuits being configured to monitor the corresponding one of the plurality of transistors by,
generating first data corresponding to a frequency and a duration of overloading of the corresponding one of the plurality of transistors, and
generating second data corresponding to a rate of rise of a voltage and a peak voltage value of the corresponding one of the plurality of transistors, wherein
each of the plurality of circuits is configured to provide the corresponding first data and the second data as outputs to a controller for analyzing a manner in which a load coupled to the inverter is driven, and
the controller is configured to analyze the manner in which the load is driven by,
receiving the first data and the second data, and
analyzing, based on the first data and the second data, the manner in which the load is driven by determining the frequency and the duration of overloading the transistors based on a frequency and width of pulses included in the first data.

11. The system of claim 10, wherein each of the plurality of circuits comprises:
a first sub-circuit configured to generate the first data during a turn-off event of the corresponding one of the plurality of transistors; and
a second sub-circuit configured to generate the second data during the turn-off event of the corresponding one of the plurality of transistors.

12. The system of claim 11, wherein the turn-off event takes place when the corresponding one of the plurality of transistors supplies peak current or near-peak current to the load.

13. The system of claim 11, wherein the first data is a series of pulses.

14. The system of claim 11, wherein the second sub-circuit is configured to generate the second data by measuring a voltage across a resistor in the second sub-circuit.

15. The system of claim 11, wherein each of the plurality of transistors further comprises:
a third sub-circuit coupled to the first and second sub-circuits, the third sub-circuit being configured to operate as an over-voltage protection for the corresponding one of the plurality of transistors.

16. The system of claim 10, wherein each of the plurality of transistors is one of an Insulated-Gate Bipolar Transistor (IGBT), a metal-oxide Semiconductor Field-Effect Transistor (MOSFET), a Silicon Carbide MOSFET or a Silicon Carbide IGBT.

17. A system comprising:
a plurality of transistors forming an inverter; and
a plurality of circuits, each of the plurality of circuits being coupled to one of the plurality of transistors, each of the plurality of circuits being configured to monitor the corresponding one of the plurality of transistors by,
generating first data corresponding to a frequency and a duration of overloading of the corresponding one of the plurality of transistors, and
generating second data corresponding to a rate of rise of a voltage and a peak voltage value of the corresponding one of the plurality of transistors, wherein
each of the plurality of circuits is configured to provide the corresponding first data and the second data as outputs to a controller for analyzing a manner in which a load coupled to the inverter is driven, and
the controller is configured to analyze the manner in which the load is driven by,
receiving the first data and the second data, and
analyzing, based on the first data and the second data, the manner in which the load is driven by,
determining, based on the second data, a temperature of the corresponding one of the plurality of transistors during a turn-off event,
developing a degradation model for the corresponding one of the plurality of transistors based on the determined temperature, and
determining a schedule for performing a maintenance of the corresponding one of the plurality of transistors based on the degradation model and a maintenance look-up table.

* * * * *